United States Patent
Ma

(12) United States Patent     (10) Patent No.: US 6,410,383 B1
Ma     (45) Date of Patent: Jun. 25, 2002

(54) METHOD OF FORMING CONDUCTING DIFFUSION BARRIERS

(75) Inventor: Yanjun Ma, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/527,541

(22) Filed: Mar. 16, 2000

(51) Int. Cl.⁷ .......................................... H01L 21/8242

(52) U.S. Cl. .................. 438/247; 438/627; 438/643; 438/648; 438/653; 438/656; 438/659; 438/695; 438/687

(58) Field of Search ................................ 438/247, 627, 438/643, 648, 653, 656, 659, 695, 687

(56) References Cited

U.S. PATENT DOCUMENTS

| | | | |
|---|---|---|---|
| 4,920,071 A | * 4/1990 | Thomas | 438/627 |
| 5,633,200 A | * 5/1997 | Hu | 438/653 |
| 5,672,541 A | 9/1997 | Booske et al. | 437/160 |
| 5,882,991 A | * 3/1999 | Paranjpe | 438/565 |
| 5,899,740 A | * 5/1999 | Kwon | 438/627 |
| 5,953,600 A | 9/1999 | Gris | 438/200 |
| 5,966,607 A | * 10/1999 | Chee et al. | 438/305 |
| 5,985,759 A | * 11/1999 | Kim et al. | 438/653 |
| 6,268,291 B1 | * 7/2001 | Andricacos et al. | 438/694 |

OTHER PUBLICATIONS

S. Wolf, Silicon Processing for the VLSI Era, Jan. 1986, Lattice Press, vol. 1 pp. 295–296.*

Thesis by Jason S. Reid entitled, "Amorphous Ternary Diffusion Barriers for Silicon Metallizations" defended May 9, 1995.

Article entitled, "Ti–Si–N Diffusion Barriers Between Silicon and Copper", by J.S. Reid, X. Sun, E. Kolawa and M.-A., Nicolet, published in IEEE Electron Device Letters, vol. 15, No. 8, Aug. 1994, pp. 298–300.

Article entitled, "Amorophous (Mo, Ta, or W)–Si–N Diffusion Barriers for Al metallizations", by J.S. Reid, E. Kolawa, C.M. Garland & M.-A. Nicolet, published in J. Appl. Phys. 79(2), Jan. 15, 1996, pp. 1109–1115.

* cited by examiner

Primary Examiner—Matthew Smith
Assistant Examiner—Belur V Keshavan
(74) Attorney, Agent, or Firm—Matthew D. Rabdau; David C. Ripma; Scott C. Krieger

(57) ABSTRACT

A method of forming conducting diffusion barriers by depositing an initial film and implanting ions to modify the film is provided. An initial film having good step coverage is deposited over a semiconductor substrate. The initial material need not have the desired properties for a conducting diffusion barrier, but preferably contains one or more elements to be used in forming a desired film with the appropriate properties. The initial material is deposited by CVD, PECVD or IMP deposition. Ions are preferably implanted using plasma immersion ion implantation (PIII), although other methods are also provided. The method of the present invention produces binary, ternary, quaternary and other more complex films, while providing adequate step coverage.

20 Claims, 3 Drawing Sheets

METHOD OF FORMING CONDUCTING DIFFUSION BARRIERS

BACKGROUND OF THE INVENTION

This invention relates generally to semiconductor technology and more particularly to a method of forming conducting diffusion barriers for semiconductor devices.

Diffusion barriers are commonly used in integrated circuit (IC) fabrication to prevent interdiffusion of metals. For example, a TiN film is used to prevent diffusion of Al into Si at contact regions and along metal lines. As the dimensions of ICs, particularly contact regions and metal lines, continue to shrink, the requirements for the conducting barrier also become more stringent. Thinner barriers are required without substantially increasing resistivity. Barriers also need to be more resistant to diffusion of various new metals, which are being introduced into production processes. One of the metals that is being introduced is copper. Although few diffusion barriers materials effectively block the diffusion of copper, metal nitride and silicon nitride have been shown to act as good barriers against copper diffusion. However, thin films with desired composition and conductivity cannot be easily deposited. This is especially true for ternary or quaternary materials.

ICs typically have structures at different heights. These structures form steps. Many of the materials being investigated for use as diffusion barriers, do not have good step coverage when deposited using conventional means. For instance, conventional sputtering methods suffer from problems of poor step coverage and composition control, especially for ternary or quaternary materials.

Step coverage refers to the ability of a deposited material to follow the underlying step to provide desirable coverage. Step coverage is defined in terms of the ratio of the thickness of the thinnest region, which is typically at the bottom corners, versus the thickness of the material deposited over a flat upper region, expressed as a percentage. Step coverage is considered good if it is equal to or greater than 70%.

Another problem associated with step coverage is caused by an over accumulation of material on the upper edges of the step. As the width of metal lines and other features get thinner, the over accumulation of material at the upper edge of a trough, also referred to as an overhang, has a tendency to significantly reduce the effective width of the feature. If the reduced effective width becomes too small, subsequent metalization processes will be unable to adequately fill the bottom of the trench.

It would be advantageous if an alternative method of forming a diffusion barrier with good step coverage and the desired characteristics could be provided.

SUMMARY OF THE INVENTION

Accordingly, a method of forming a diffusion barrier is provided. The method comprises the steps of:
  a) providing a semiconductor substrate;
  b) depositing a layer of an initial material; and
  c) implanting ions into the initial material to form a desired material.

Following implanting, the semiconductor substrate is annealed to reduce or eliminate implant damage and achieve the appropriate composition and crystallinity. Metal is preferably deposited within a trench to form a metal line.

Preferably, the layer of initial material is formed by chemical vapor deposition (CVD), plasma-enhanced chemical vapor deposition (PECVD), or ion metal plasma (IMP) deposition. Deposition is preferably a low temperature deposition at less than 450 degrees Celsius. The initial material can be selected from a wide variety of materials. The initial material need not have good conductivity or barrier properties. Preferably, the initial material will provide good step coverage, and provide at least some of the material necessary to produce a final desired material having sufficient conductivity and barrier properties for the desired metal line. The initial material can comprise a single element, a binary material, or even, ternary or quaternary materials, provided they have adequate step coverage. The terms binary, ternary, and quaternary are used through out this specification to refer to materials having two elements, three elements, and four elements, respectively. In common usage, these terms refer to compounds. As used herein, these terms may include compounds, alloys or other categories of materials having the designated number of elements.

After the initial layer is deposited, ions are implanted to modify the initial material. The implanted ions should be selected such that they improve the properties of the initial material, or assist in converting the new material into a desired material. For a diffusion barrier, the implanted ions should aid in producing materials having good conductivity and barrier properties. Preferably, the ion will be implanted using plasma immersion ion implantation (PIII). The substrate will be laced within a PIII chamber. A gas containing a desired element is introduced into the PIII chamber and energized to form a plasma of ionized gas. The ions contained within the ionized gas are implanted into the silicon substrate. Preferably, the substrate will be negatively biased to attract the positive ions. Although using PIII is preferred, it is also possible to implant the ions by convention ion implantation methods or using ion metal plasma (IMP) techniques.

Following deposition and implantation, the entire semiconductor substrate is annealed to condition the implanted material. Preferably, a rapid thermal anneal (RTA) process is applied to the wafer to anneal out implant damage and to achieve the appropriate composition and crystallinity. Alternatively, a convention heat treatment is applied to the wafer using a furnace.

Subsequent processing can be performed to complete the formation of the barrier layer, including depositing a metal layer.

DETAILED DESCRIPTION OF THE INVENTION

Figure 1:
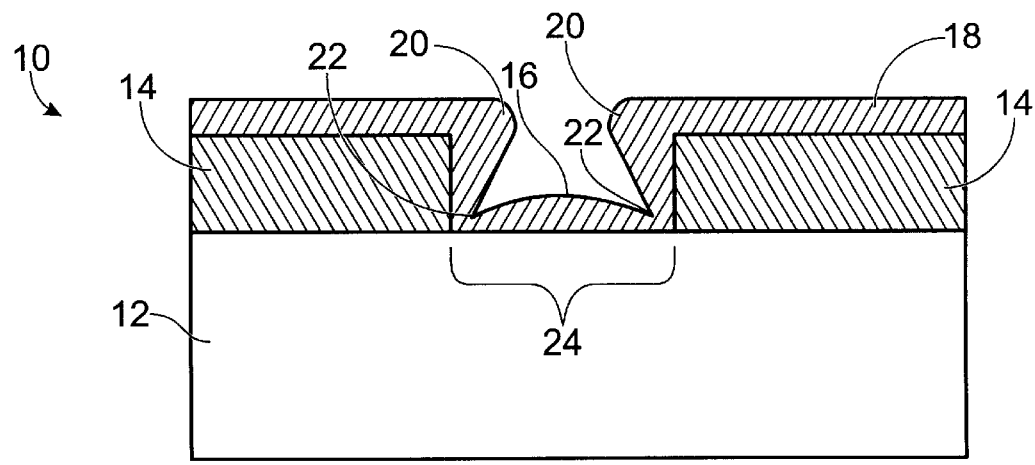
FIG. 1 is a schematic cross-sectional view showing an integrated circuit (IC) structure with a conventionally deposited barrier layer (prior art).

Referring now to the drawings, which are for illustration purposes (not to scale), FIG. 1 illustrates the prior art problems related to poor step coverage. The dimensions are exaggerated for illustration purposes. A partially completed IC device 10 comprises a semiconductor substrate 12 with isolation regions 14 forming a trench 16. A diffusion barrier layer 18 has been deposited. Due to poor step coverage, over accumulation regions 20 were formed along with thinner regions 22. As the length 24 of trench 16 diminishes, eventually the over accumulation regions 20 will prevent subsequent metal layers from being properly deposited within the trench 16. In addition, due to the poor step coverage uniform thickness is not maintained along the bottom of the trench 16.

Figure 2:
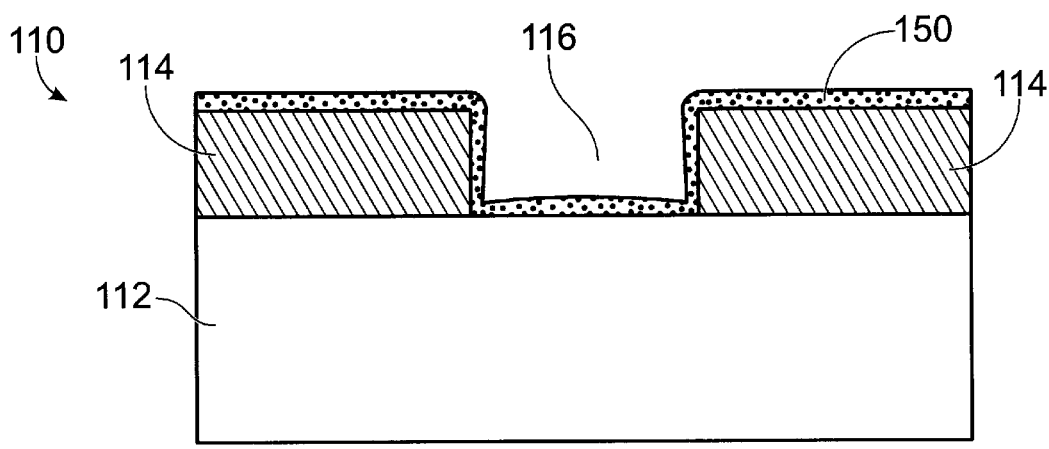
FIG. 2 is a schematic cross-sectional view showing an IC structure during processing with an initial material deposited to form a layer.
Figure 3:
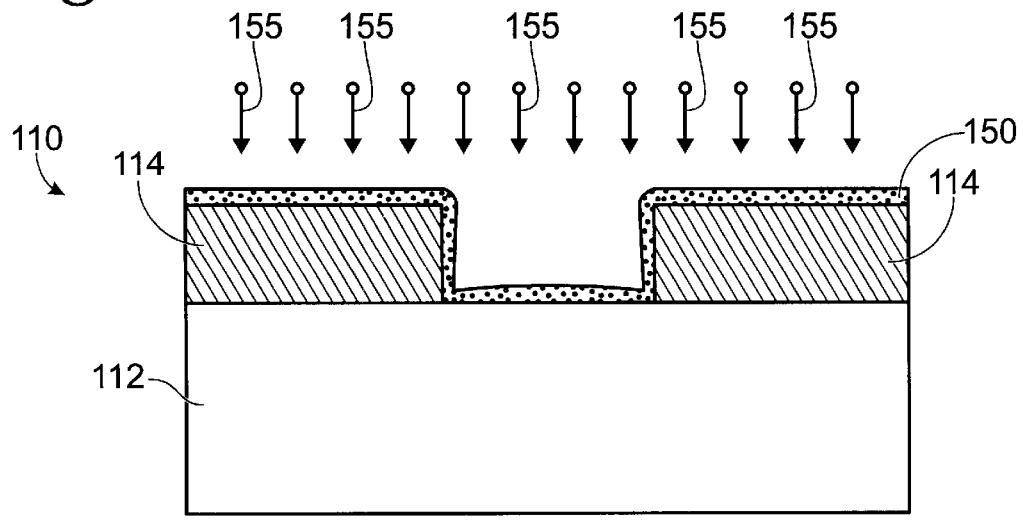
FIG. 3 is a schematic cross-sectional view showing ions being implanted into the layer of initial material.
Figure 4:
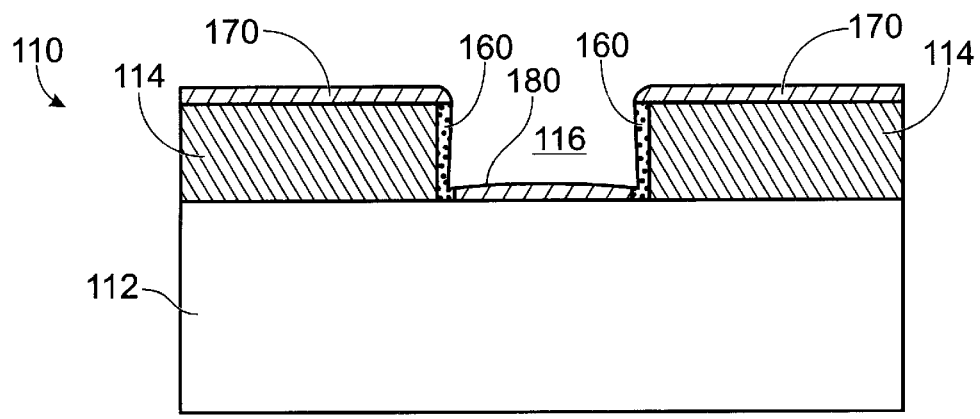
FIG. 4 is a schematic cross-sectional view showing the layer following implantation and anneal.

FIGS. 2–4 illustrate the steps of the method of the present invention. A partially completed IC device 110 is provided having a semiconductor substrate 112 with isolation regions 114 forming a trench 116. Although semiconductor substrate 112 is depicted as a single conductive layer, the method of the present invention is well suited to more complicated configurations, including metal layers overlying previously deposited metal layers and interconnecting vias. A layer 150, also referred to as a film, of an initial material is deposited using conventional deposition techniques. As shown in FIG. 2, the initial material is deposited with good step coverage, preferably equal to or greater than approximately 70%. The initial material is selected such that it will aid in forming a desired material upon completion of the method of the present invention. The initial material need not have good conductivity or good barrier properties in and of itself Layer 150 is preferably formed using chemical vapor deposition (CVD), plasma-enhanced chemical vapor deposition (PECVD) or ion metal plasma (IMP) deposition. The initial material is preferably one that is well suited to low temperature CVD or PECVD techniques. Low temperature processing is preferred, because high temperature processes may adversely affect materials and structures that were previously formed. The initial material is preferably a binary, such as Si—N, Ti—N, W—N, W—Si, Ti—Si, Ta—Si Ta—N, Si—C, or B—N; or, alternatively, an elemental film such as Si, Ti, W, Ta, Ru, Mo, C, or B. It would also be possible to deposit a combination of multiple elemental materials, multiple binary materials or a combination of both. It is also within the scope of this invention to deposit ternary or other more complicated materials, provided that the material can be deposited with good step coverage.

Referring now to FIG. 3, the initial material of layer 150 is modified by implanting ions 155 (represented by arrows). Ions 155 change one or more of the characteristics of the desired material upon completion of the method of the present invention. Ions 155 modify layer 150 to produce a material with good conductivity, good barrier properties, or both. It is not always convenient, or possible, to initially deposit a film with a desired ratio of elements. The method of the present invention allows for the deposition of a film followed by implanting to change the ratio of the elements within the film. In one preferred embodiment, ions 155 are selected from one of the elements forming a previously deposited material. If tantalum-nitride (Ta—N) is initially deposited, tantalum (Ta) is implanted into the previously deposited film. Increasing the amount of Ta by implanting will reduce resistivity. This technique is also useful in connection with Ti—N films, or other films.

In another preferred embodiment of the present invention, the initial material of layer 150 is modified by implanting ions 155 that include an element that was not previously deposited. To produce a desired film of W—Si—N, W—Si is deposited to form layer 150. Nitrogen (N) is then implanted into the film to form the desired W—Si—N. Alternatively, a film of W—Si—N is produced by depositing a layer of Si—N and implanting W. It is also within the scope of the present invention to implant more than one element. If a thin film of Si is deposited, both W and N are implanted to form the desired W—Si—N film of desired composition.

The method of the present invention can be used to produce quaternary or more complex materials. For example, Si—N is deposited and implanted with B and Ta to form Ta—B—Si—N. The implant is preferably accomplished by depositing one material at a time in order to provide better control of implant dosage, however, it may also be possible to introduce both materials simultaneously.

After implanting ions 155 of the desired element, or elements, layer 150 is annealed to remove implant damage and to achieve the appropriate composition and crystallinity. Conventional heat treatment or rapid thermal annealing process are used to anneal layer 150. FIG. 4 shows layer 150 after implant and anneal. Sidewalls 160 did not receive as high of an implant dose as upper areas 170 or bottom 180 of trench 116. Although sidewalls 160 do not receive as high of an implant dose, for many applications the sidewalls are less critical in terms of barrier or conductivity properties. It is also possible to increase the implant dose along sidewalls 160 by changing the placement of the wafer within the plasma chamber to provide a variety of implant angles.

Figure 5:
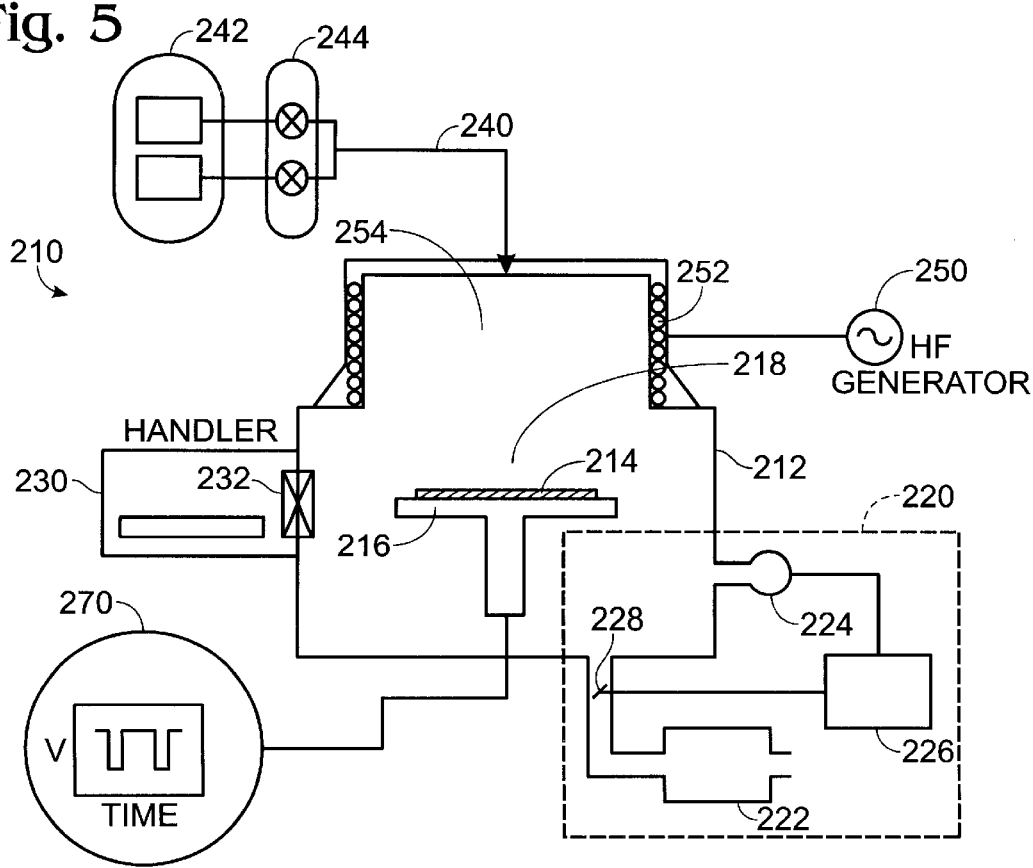
FIG. 5 is a schematic view showing a plasma ion immersion implantation system.

FIG. 5 shows a schematic illustration of a suitable plasma immersion ion implantation system 210 for carrying out the ion implant step of the present invention.

Plasma immersion ion implantation system 210 includes a plasma chamber 212 of a size suitable for holding one or more substrates 214, which are supported in the chamber on a chuck 216. Substrate 214 is also commonly referred to as a "wafer". The interior 218 of the chamber 212 can be evacuated, and its pressure regulated, by a pressure control system 220.

Pressure control system 220 includes a pump 222 for exhausting spent gases and contaminants, if any. To control pressure within interior 218 of plasma chamber 212, a pressure sensor 224 is connected to a pressure controller 226, which controls a throttle valve 228. When pressure controller 226 determines that sensor 224 has detected a pressure within interior 218 of the chamber 212 that is outside a predetermined range, pressure controller 226 adjusts valve 228 as necessary to compensate and return the pressure to within the predetermined range.

In a preferred embodiment of the present invention, individual substrates 214 can be moved in and out of chamber 212 by a suitable handler 230 through a gate valve 232 in a chamber wall, allowing substrates to be moved onto a chuck 216 for processing, and then removed from chamber 212. The mechanism by which substrates 214 are moved into the chamber is not critical to the method of the present invention.

Selected gases used in plasma doping during the ion implantation step are introduced into the chamber 212 through a suitable manifold system 240 from various gas supply reservoirs indicated collectively at 242, controlled by valves indicated at 244. For simplicity only two gas supply reservoirs are shown. It is entirely possible, and not inconsistent with the present invention, to have additional gas supply reservoirs, or only a single gas supply reservoir. The manifold system 240, which is shown schematically, may include a gas inlet for blending the gases or a showerhead for distributing the gases within chamber 212 (neither of which are shown).

Plasma energy is supplied to the chamber 212 by an RF generator 250 that typically supplies high frequency (HF) RF power through coils 252 to energize gases within the chamber forming a plasma within plasma formation region 254. The process of energizing gases to form a plasma is also referred to as "igniting a plasma". An inductively coupled plasma of between 300 and 3000 watts is used within chamber 212 at a pressure of between approximately 10 and 100 mT.

The plasma contains implant ions 155 used to modify layer 150 (see FIG. 3). The plasma may contain additional ions, including dilutant gas ions. For example, to implant nitrogen (N) the plasma comprises nitrogen, or nitrogen mixed with an inert dilutant gas, such as argon (Ar). To implant tantalum (Ta), which is not generally a gas at the temperatures and pressures used in the method of the present invention, a gas of $TaF_6$ would be used along with an inert dilutant gas or hydrogen. Likewise, to implant tungsten (W), a gas of $WF_6$ would be used along with an inert dilutant gas or hydrogen. To implant titanium (Ti), a gas of $TiCl_4$ would be used along with an inert dilutant gas or hydrogen. The actual gas selected will depend upon which implant ion is to be implanted. The above examples are for illustration purposes, numerous additional gases containing desired elements can be readily determined, without undue experimentation, by one of ordinary skill in the art. These additional gases are also within the scope of the present invention. Although it is preferable to use a dilutant gas or hydrogen, it is not necessary to the present invention.

To increase implant energies, and improve control of the implant process, substrate 214 is preferably biased with a negative voltage to attract the positive ions formed within the plasma. Preferably, the negative voltage bias will be pulsed. Pulsing allows the implanted ions to return to an electrically neutral state, which helps to avoid an accumulation of positive charge along the surface of the substrate 214. The pulsed negative voltage bias is applied to the substrate 214 by a pulse generator 270, shown schematically connected to the chuck 216. The pulses are between approximately 50 volts (V) and 10 kV, but preferably 1 kV. The pulse width is between approximately 10 microseconds and 1000 microseconds, but preferably approximately 100 microseconds, at a frequency between approximately 100 Hz and 5 kHz, but preferably 500 Hz.

Figure 6:
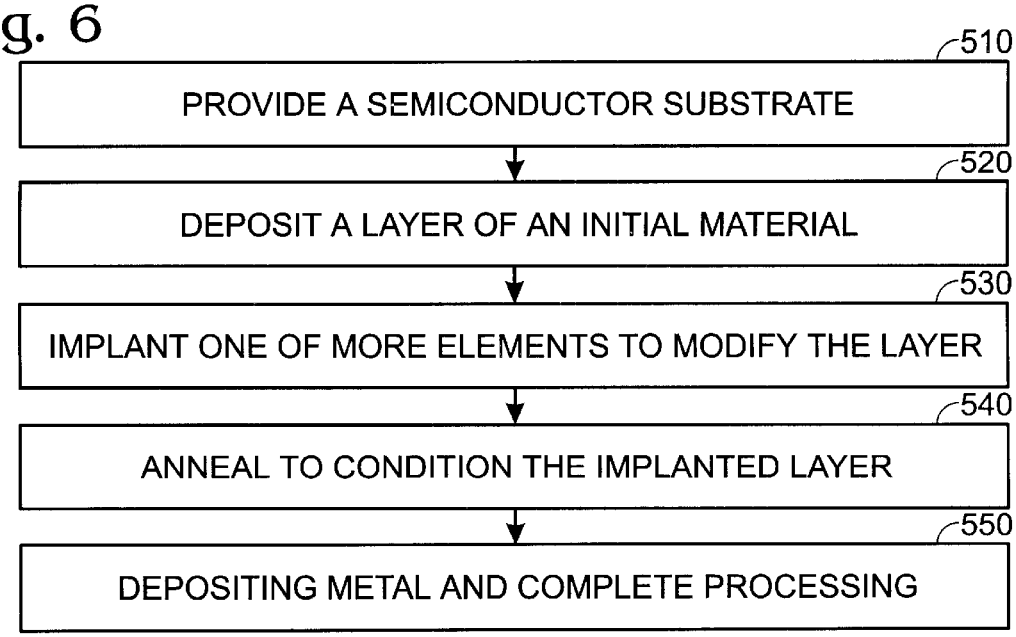
FIG. 6 is a flow chart summarizing the steps in the method of the present invention.

The steps in the method of the present invention are illustrated schematically in FIG. 6. The first step 510 is to provide a semiconductor substrate. The semiconductor substrate will have a trench, or contact, open to the underlying device, or multiple metal layers and interconnects, or vias as necessary to provide connections across a final device after processing.

Step 520 is the depositing of a thin layer of less than 500 Å of an initial material, such as Si, Ti, W, Ta, Ru, Mo, C, B, Si—N, Ti—N, Ti—Si, W—N, W—Si, Ta—Si, Ta—N, Si—C, or B—N. In a preferred embodiment, the initial material will be between approximately 25 Å and 100 Å, but preferably 50 Å.

In a preferred embodiment of the present invention, chemical vapor deposition (CVD) is used to deposit the initial material. Preferably, low temperature CVD. For example to form a layer of the initial material Ti—N, a precursor of Tetrakis (DiMethylAmino) Titanium (Ti(N $(CH_3)_2)_4$), also referred to as TDMAT, would be used. The substrate would be exposed to the precursor at a temperature of between 350 and 450 degrees Celsius. Although the above example was provided for titanium nitride (Ti—N), one of ordinary skill in the art will be able to determine, without undue experimentation, the proper precursor and process conditions for other desired initial materials.

Alternatively, plasma-enhanced chemical vapor deposition (PECVD) could also be used to deposit the initial material. For example if PECVD is used to deposit $W_2N$, a precursor of $WF_6+N_2+H_2$ would be used. The substrate would be exposed to the precursor with a PECVD system at a temperature between approximately 350 and 450 degrees Celsius. Although the above example was provided for PECVD deposition of tungsten nitride ($W_2N$), one of ordinary skill in the art will be able to determine, without undue experimentation, the proper precursor and process conditions for other desired initial materials.

In another embodiment of the present method, ion metal plasma (IMP) sputter deposition could be used to deposit the initial material. IMP is a method of physical vapor deposition (PVD). In particular, IMP sputtering refers to deposition sputtering, where sputtered target material is passed through an ionization means, such as an inductively coupled RF source, to create a high density, inductively coupled RF plasma between the sputtering target material and the substrate. This ensures that a higher portion of the sputtered emission is in the form of ions at the time it reaches the substrate surface. Although not required, the substrate toward which the sputtered ions are moving is typically biased to attract the incoming ions.

Step 530 is the implanting of one or more elements to modify the properties of the initial material. The implanted elements are preferably selected from Si, N, Ti, W, Ta, C, B, P, O, Cl or F. Although, only a single element will preferably be implanted at one time, it is also possibly to implant multiple elements simultaneously or in sequence. The step of implanting is accomplished by plasma immersion ion implantation (PIII). The substrates are introduced into a plasma chamber, and exposed to a plasma containing ions, as described above with reference to FIG. 5. For example to implant nitrogen into a previously deposited layer of W—Si to form W—Si—N, as discussed above, nitrogen is implanted at energies between approximately 0.1 keV and 2 keV, at a dose between $1 \cdot 10^{13}/cm^2$ and $1 \cdot 10^{16}/cm^2$, in the preferred embodiment. Implantation time varies from 10 seconds to 3 minutes. Although PIII is preferred because of its lower energy, and higher dosage characteristics, the step of implanting is also possible using conventional ion beam implantation methods.

In another alternative embodiment, the ions could be implanted using ion metal plasma (IMP). IMP is similar in some ways to PIII, but utilizes a sputter target instead of a gas to introduce the desired implant ions. In which case a solid target comprising Ta, Ti, W or other solid material could be used. One possible problem with IMP, is that all of the material from the target is not ionized within the plasma, which may make dosage control more difficult. Some of the material will be ionized and implanted, while other non-ionized material will be deposited by sputtering. It should be noted that although IMP has been used to form diffusion barriers in the past, the inventor is unaware of IMP being used to implant additional elements to modify the characteristics of a previously deposited film.

Step 540 is the annealing of the implanted material. The wafer, including the implanted material, is heat treated using a furnace or a rapid thermal anneal process to anneal out implant damage and to achieve the appropriate composition and crystallinity.

Step 550 is the deposition of a metal film and subsequent processing according to any state of the art methods. The metal film is aluminum, copper or any other desired metal.

Although the illustrations show application of the present invention to a relatively simple trench structure, the present invention is also well suited to the formation of more complicated trench structures, including multiple conductive layers and vias.

Alternative embodiments are possible within the scope of the present invention. As is clear from the illustrative examples, the invention can be practiced using a variety of materials, deposition techniques, and implant methods. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming a conducting barrier for integrated circuits comprising the steps of:
   a) providing a semiconductor substrate;
   b) depositing a layer of an initial material; and
   c) implanting ions into the initial material to form an implanted material; and
   d) annealing the implanted material to form a desired material.

2. The method of claim 1, wherein the initial material comprises an elemental material.

3. The method of claim 1, wherein the initial material comprises a binary material.

4. The method of claim 1, wherein the desired material is a binary material.

5. The method of claim 1, wherein the desired material is a ternary material.

6. A method of forming a thin conducting film comprising the steps of:
   a) providing a substrate;
   b) depositing a film over the substrate;
   c) implanting an element into the film to form an implanted film;
   d) annealing the implanted film; and
   e) depositing a metal film over the implanted film.

7. The method of claim 6, wherein the step of depositing the film over the substrate further comprises depositing the film over structures at different heights on the substrate.

8. The method of claim 6, wherein the film is less than approximately 1000 angstroms thick.

9. The method of claim 6, wherein the film is deposited using chemical vapor deposition (CVD).

10. The method of claim 9, wherein the film can be deposited using low-temperature CVD.

11. The method of claim 6, wherein the film is deposited using plasma enhanced chemical vapor deposition.

12. The method of claim 6, wherein the film comprises a material selected from the group consisting of Si, Ti, W, Ta, Ru, Mo, C, and B.

13. The method of claim 6, wherein the film comprises a material selected from the group consisting of Si—N, Ti—N, Ti—Si, W—N, W—Si, Ta—Si, Ta—N, Si—C, and B—N.

14. The method of claim 6, wherein the implanted element comprise a material selected from the group consisting of Si, N, Ti, W, Ta, C, B, P, O, Cl, and F.

15. The method of claim 6, wherein the implanted film formed is Ta—N, Ti—N, W—Si—N, Ta—Si—N, Ti—Si—N or Ta—B—Si—N.

16. A method of forming a conducting barrier for integrated circuits comprising the steps of:
   a) providing a semiconductor substrate;
   b) depositing a layer of an initial material; and
   c) implanting ions into the initial material to form an implanted material; and
   d) annealing the implanted material to form a desired material, wherein the desired material is a quaternary material.

17. A method of forming a thin conducting film comprising the steps of:
   a) providing a substrate;
   b) depositing a film over the substrate using ion metal plasma deposition;
   c) implanting an element into the film to form an implanted film;
   d) annealing the implanted film; and
   e) depositing a metal film over the implanted film.

18. A method of forming a thin conducting film comprising the steps of:
   a) providing a substrate;
   b) depositing a film over the substrate;
   c) implanting an element into the film to form an implanted film;
   d) implanting a second element into the film forming an implanted film;
   e) annealing the implanted film; and
   f) depositing a metal film over the implanted film.

19. A method of forming a thin conducting film comprising the steps of:
   a) providing a substrate;
   b) depositing a film over the substrate;
   c) implanting an element into the film using plasma immersion ion implantation to form an implanted film;
   d) annealing the implanted film; and
   e) depositing a metal film over the implanted film.

20. A method of forming a thin conducting film comprising the steps of:
   a) providing a substrate;
   b) depositing a film over the substrate;
   c) implanting an element into the film using ion metal plasma to form an implanted film;
   d) annealing the implanted film; and
   e) depositing a metal film over the implanted film.

* * * * *